United States Patent
Yoshikawa

(10) Patent No.: US 6,338,997 B2
(45) Date of Patent: Jan. 15, 2002

(54) METHOD OF FABRICATING SEMICONDUCTOR DEVICE HAVING IMPROVED BIAS DEPENDABILITY

(75) Inventor: Koichi Yoshikawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/746,691

(22) Filed: Dec. 21, 2000

(30) Foreign Application Priority Data

Dec. 22, 1999 (JP) ............................................ 11-364147

(51) Int. Cl.⁷ .......................................... H01L 21/8242
(52) U.S. Cl. ........................ 438/250; 438/253; 438/393
(58) Field of Search ................. 438/238–240, 438/393–399, 381, 250–256

(56) References Cited

U.S. PATENT DOCUMENTS 6,156,602 A * 12/2000 Shao et al. .................. 438/238

6,171,901 B1 * 1/2001 Blair et al. .................. 438/250

* cited by examiner

*Primary Examiner*—Jey Tsai
(74) *Attorney, Agent, or Firm*—Roseman & Colin LLP

(57) ABSTRACT

On a semiconductor substrate is formed an insulating layer having a gate insulating region, which is coated with a first polysilicon layer having a first portion and a second portion which contacts the gate insulating region. The first portion of the first polysilicon layer is then doped with an impurity such as phosphorous. The first polysilicon layer is coated with a second insulating layer on which is formed a second polysilicon layer. A first selective etching process is provided so that a capacitive insulating layer and an upper polysilicon electrode are successively formed on the first portion of the first polysilicon layer and the second portion of the first polysilicon layer is exposed. A second selective etching process is performed so that the first and second portions of the first polysilicon layer define a lower polysilicon electrode and a gate electrode, respectively. As a result, there is produced a semiconductor device having a lower polysilicon electrode doped with an impurity of conductivity type identical to conductivity type of the polysilicon gate electrode.

3 Claims, 3 Drawing Sheets

METHOD OF FABRICATING SEMICONDUCTOR DEVICE HAVING IMPROVED BIAS DEPENDABILITY

BACKGROUND OF THE INVENTION

1. Field of the Invention

The present invention relates generally to semiconductor devices, and more specifically to an analog semiconductor devices having upper and lower polysilicon electrodes and a method of fabricating the semiconductor device.

2. Description of the Related Art

Analog metal-oxide-semiconductor transistors are composed of a gate formed on an oxide layer, and a source and a drain each being formed of upper and lower polysilicon electrodes and a capacitive element sandwiched therebetween. This capacitive element is required that a deviation from the specified capacitance value must be maintained in as small a range as possible under varying operating voltages. The lower polysilicon electrode and the gate are usually fabricated simultaneously. However, in the prior art transistor, the lower polysilicon electrode has no sufficient level of impurity dose to provide desired bias dependability. Thus there is a need to improve the bias dependability of a semiconductor device.

SUMMARY OF THE INVENTION

It is therefore an object of the present invention to provide a semiconductor device with a lower polysilicon electrode having an impurity dose that is sufficient to obtain desired bias dependability and a method of fabricating the semiconductor device.

According to one aspect of the present invention, there is provided a semiconductor device comprising a semiconductor substrate, an insulating layer on the substrate, the insulating layer having a gate insulating region, a lower polysilicon electrode on the insulating layer, a capacitive insulating layer on the lower polysilicon electrode, an upper polysilicon electrode on the capacitive insulating layer, and a polysilicon gate electrode on the gate insulating region, the gate electrode being of equal thickness to the lower polysilicon electrode. The lower polysilicon electrode is doped with an impurity of conductivity type identical to conductivity type of the polysilicon gate electrode.

According to a further aspect, the present invention provides a method of fabricating a semiconductor device, comprising the steps of a (a) forming a first insulating layer with a gate insulating region on a semiconductor substrate, (b) forming a first polysilicon layer on the first insulating layer and the gate insulating region, the first polysilicon layer having a first portion spaced from a second portion which contacts the gate insulating region, (c) doping an impurity into the first portion of the first polysilicon layer, the impurity having a conductivity type equal to conductivity type of the first polysilicon, (d) forming a second insulating layer on the first polysilicon layer, (e) forming a second polysilicon layer on the second insulating layer, (f) performing a first selective etching process so that a capacitive insulating layer and an upper polysilicon electrode are successively formed on the first portion of the first polysilicon layer and the second portion of the first polysilicon layer is exposed, and (g) performing a second selective etching process so that the first and second portions of the first polysilicon layer define a lower polysilicon electrode and a gate electrode, respectively.

BRIEF DESCRIPTION OF THE DRAWINGS

The present invention will be described in detail further with reference to the following drawings, in which:

FIGS. 1 to 8 are cross-sectional views of a semiconductor device of successive stages of the fabrication process of the present invention, wherein FIG. 1 illustrates the formation of a first insulating layer and a gate insulation layer on a semiconductor substrate and the deposition of a first polysilicon layer on the device;

FIG. 2 illustrates a first impurity doping process on a selected portion of the first polysilicon layer;

FIG. 3 illustrates the deposition of a second insulating layer on the first polysilicon layer;

FIG. 4 illustrates the deposition of a second polysilicon layer and a second impurity doping process on the second polysilicon layer;

FIGS. 5 and 6 illustrate a first etching process on a selected portion of the second polysilicon layer and the underlying second insulating layer; and FIGS. 7 and 8 illustrate a second etching process.

DETAILED DESCRIPTION

Referring to FIGS. 1 to 8, a fabrication process of a semiconductor device according to the present invention is illustrated.

Figure 1:
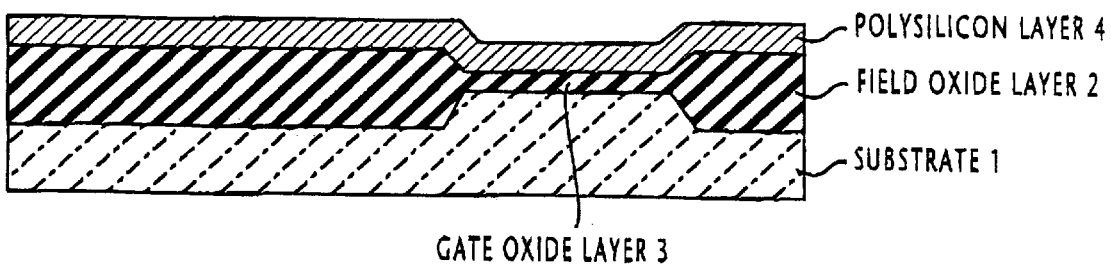

In FIG. 1, a field oxide layer 2 is formed on a semiconductor substrate 1 as a device separator to a thickness of 200 to 500 nanometers. After forming a gate oxide layer 3, the device is coated with a polysilicon layer 4 with a thickness of 100 to 250 nanometers. A lower electrode and a gate will be formed from this polysilicon layer.

Figure 2:
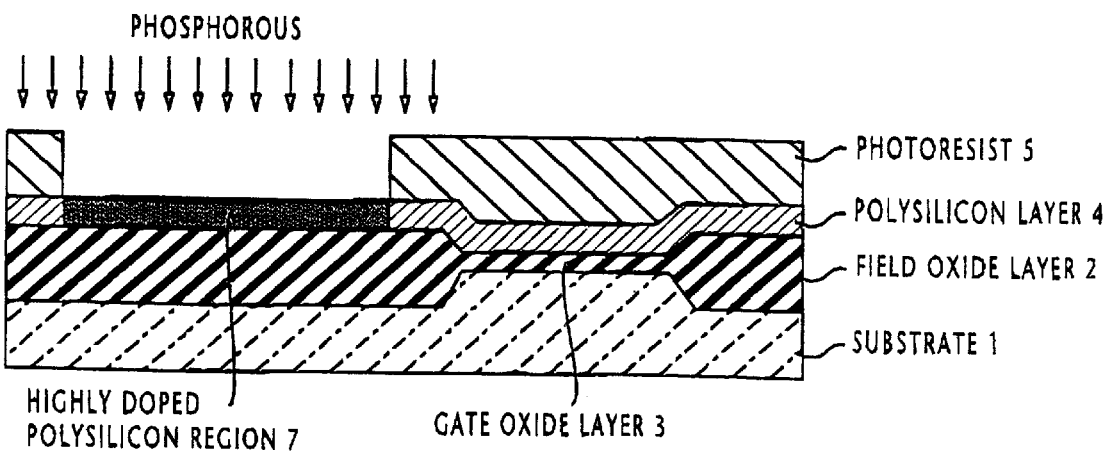

In FIG. 2, photoresist 5 is used to provide ion implantation of phosphorous, whereby a polysilicon region selected for the lower electrode is doped with the impurity of the same conductivity type as the conductivity type of a polysilicon region to be selected as a gate electrode on the gate oxide layer 3. If these polysilicon regions are of the N-type conductivity, the doping is continued until an impurity dose of $1 \times 10^{15}/cm^3$ to $1 \times 10^{16}/cm^3$ is attained. A highly doped polysilicon region 7 is thus formed. Note that phosphorous is of the same conductivity type as the conductivity type of a region above the gate oxide layer 3.

Figure 3:
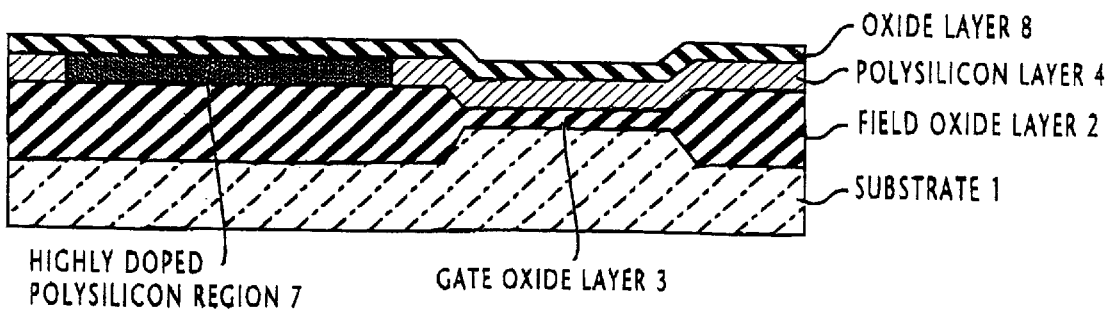

After removing the photoresist 5, an oxide layer 8 is formed on the device to a thickness of 20 to 50 nanometers, as shown in FIG. 3.

Figure 4:
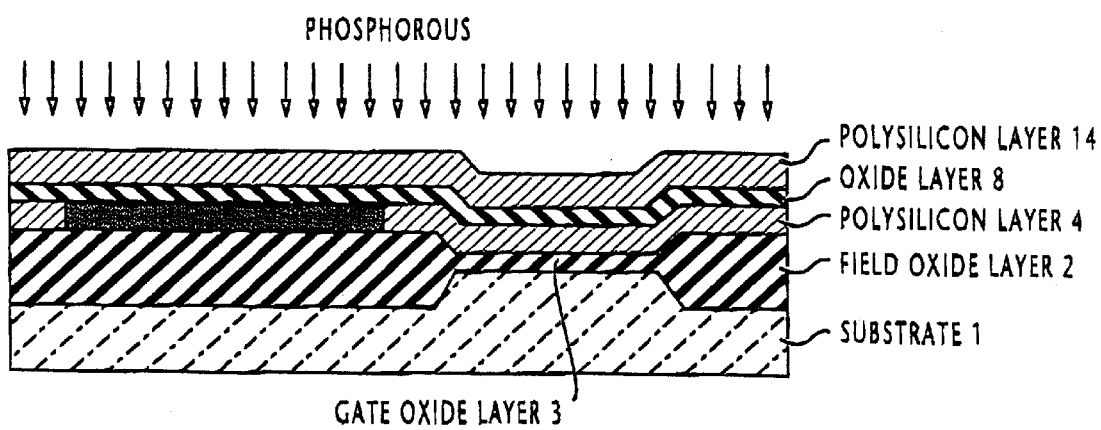

In FIG. 4, a polysilicon layer 14 of thickness 100 to 200 nanometers is grown on the oxide layer 8 and the polysilicon layer 14 is then doped with phosphorous in an ion implantation process. If the polysilicon layer 14 is of the N-type conductivity, the doping is continued until an impurity dose of $1 \times 10^{15}/cm^3$ to $1 \times 10^{16}/cm^3$ is reached.

Figure 5:
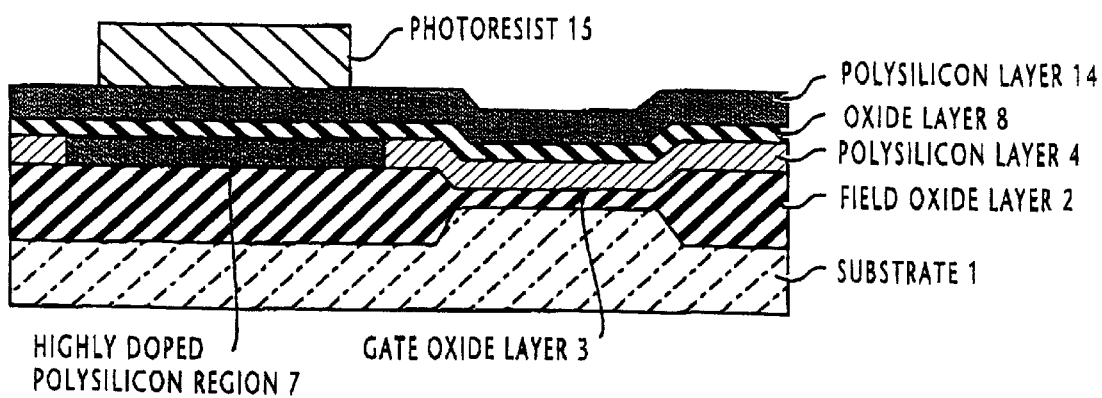
Figure 6:
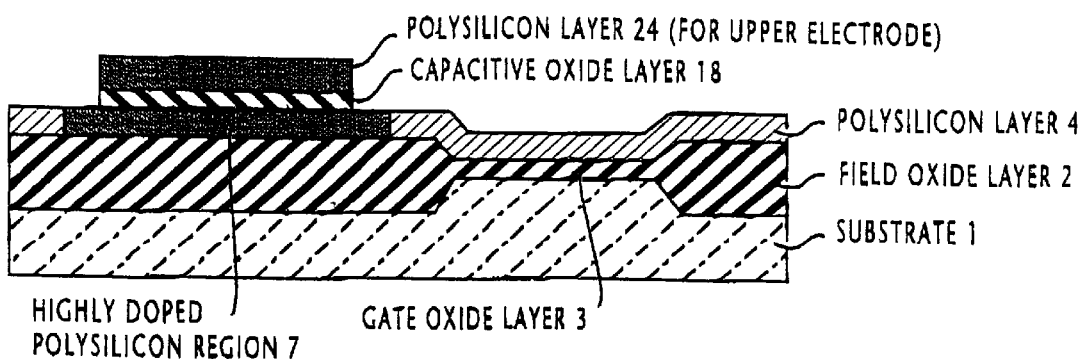

In FIG. 5, the polysilicon layer 14 and oxide layer 8 are selectively etched by using a photoresist 15. As a result, a capacitive oxide layer 18 is formed on the highly doped polysilicon region 7 and a doped polysilicon layer 24 on the capacitive layer 18, as shown in FIG. 6.

Figure 7:
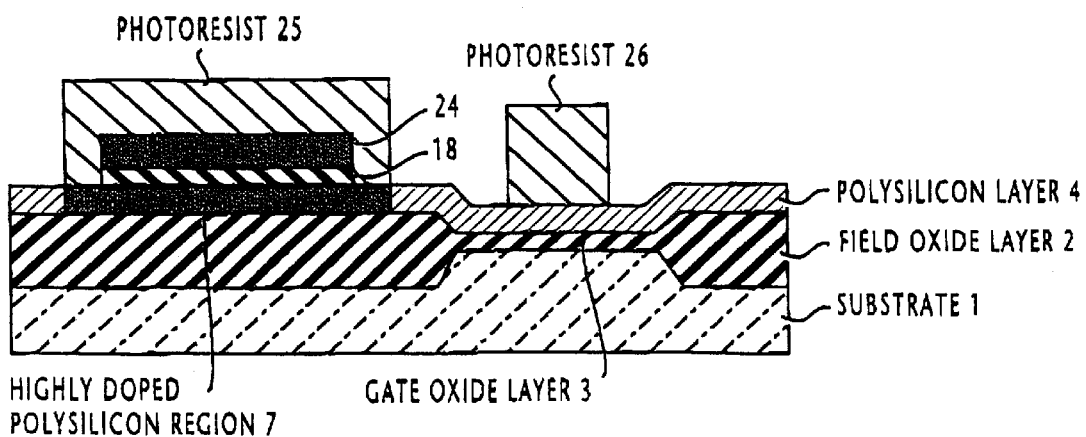
Figure 8:
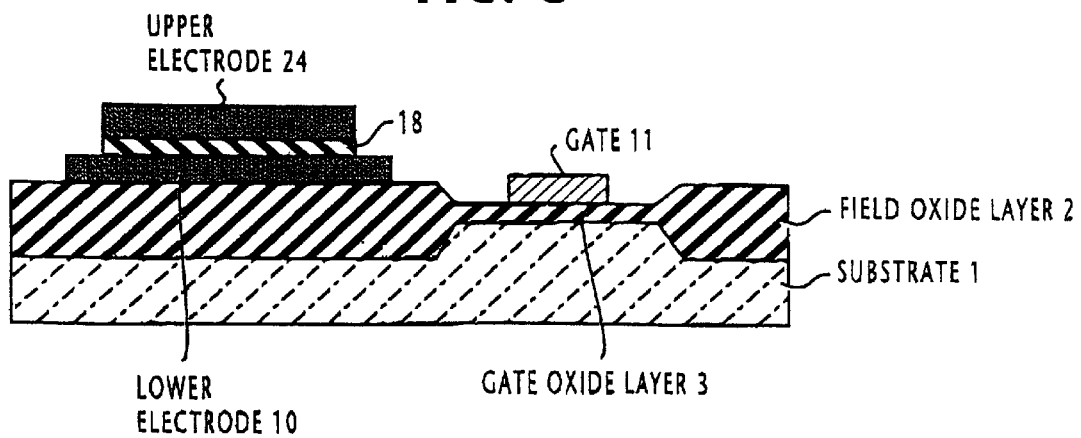

In FIG. 7, the polysilicon layer 4 is selectively etched by using photoresists 25 and 26 so that the lower polysilicon electrode 10 and the gate 11 are formed as shown in FIG. 8.

The bias dependability of the transistor of this invention is improved to 0.01%/volts to 0.03%/volts, as opposed to the dependability value of 0.3%/volts to 0.5%/volts of the prior art transistor in which the lower polysilicon electrode is not ion-injected with phosphorous.

What is claimed is:

1. A method of fabricating a semiconductor device, comprising the steps of:

a) forming a first insulating layer with a gate insulating region on a semiconductor substrate;

b) forming a first polysilicon layer on said first insulating layer and said gate insulating region, said first polysilicon layer having a first portion spaced from a second portion which contacts said gate insulating region;

c) doping an impurity into said first portion of said first polysilicon layer by injecting ions, said impurity having a conductivity type equal to conductivity type of said first polysilicon layer until a dose of $1 \times 10^{15}/cm^3$ to $1 \times 10^{16}/cm^3$ is attained;

d) forming a second insulating layer on said first polysilicon layer;

e) forming a second polysilicon layer on said second insulating layer;

f) doping said second polysilicon layer with the impurity identical to the impurity of step c) by injecting said ions until the dose of step c) is attained;

g) performing a first selective etching process so that a capacitive insulating layer and an upper polysilicon electrode are successively formed on said first portion of the first polysilicon layer, and said second portion of the first polysilicon layer is exposed; and h) performing a second selective etching process so that said first and second portions of the first polysilicon layer define a lower polysilicon electrode and a gate electrode, respectively.

2. The method of claim 1, wherein step (b) is continued until said first polysilicon layer attains a thickness of 100 of 250 nanometers, and step (e) is continued until said second polysilicon layer attains a thickness of 100 to 200 nanometers.

3. The method of claim 1, wherein step (d) is continued until said second insulating layer attains a thickness of 20 to 50 nanometers.

* * * * *